US009316211B2

(12) United States Patent
Tanaka

(10) Patent No.: US 9,316,211 B2
(45) Date of Patent: Apr. 19, 2016

(54) ACTUATOR AND METHOD FOR MANUFACTURING THE SAME

(75) Inventor: Hideki Tanaka, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 492 days.

(21) Appl. No.: 13/605,423

(22) Filed: Sep. 6, 2012

(65) Prior Publication Data

US 2013/0062993 A1    Mar. 14, 2013

(30) Foreign Application Priority Data

Sep. 14, 2011   (JP) ................. 2011-200256

(51) Int. Cl.
| | |
|---|---|
| *H02N 11/00* | (2006.01) |
| *H02N 2/02* | (2006.01) |
| *H02N 2/04* | (2006.01) |
| *H05K 3/02* | (2006.01) |
| *F03G 7/00* | (2006.01) |
| *H02N 2/00* | (2006.01) |

(52) U.S. Cl.
CPC  *F03G 7/005* (2013.01); *H02N 2/00* (2013.01); *H02N 2/02* (2013.01); *H02N 2/04* (2013.01); *H02N 11/00* (2013.01); *H05K 3/02* (2013.01); *H05K 3/027* (2013.01); *Y10T 29/49155* (2015.01)

(58) Field of Classification Search
CPC ......... H02N 11/00; H02N 11/08; H02N 2/00; H02N 2/02; H02N 2/04; H05K 3/02; H05K 3/027
USPC ................................................ 310/300, 302
See application file for complete search history.

(56) References Cited

U.S. PATENT DOCUMENTS

| | | | |
|---|---|---|---|
| 5,268,082 A * | 12/1993 | Oguro et al. ............... | 204/282 |
| 6,762,210 B1 | 7/2004 | Oguro et al. | |
| 7,169,822 B2 | 1/2007 | Oguro et al. | |
| 8,487,505 B2 * | 7/2013 | Ikushima et al. ........... | 310/300 |

(Continued)

FOREIGN PATENT DOCUMENTS

| | | |
|---|---|---|
| EP | 0 924 846 A2 | 6/1999 |
| JP | A-4-275078 | 9/1992 |
| JP | A-6-6991 | 1/1994 |

(Continued)

OTHER PUBLICATIONS

Fuchiwaki et al. (JP 2006299842)(Nov. 2006) English Translation.*

(Continued)

*Primary Examiner* — John K Kim
*Assistant Examiner* — Robert E Mates
(74) *Attorney, Agent, or Firm* — Oliff PLC

(57) ABSTRACT

Provided are an actuator that is small, superior in terms of high-speed response, and capable of large displacement, and a manufacturing method that can easily manufacture the actuator. The actuator is configured by a laminated body including multiple electrodes, multiple cation-exchange resin films, and multiple anion-exchange resin films. The cation-exchange resin films and the anion-exchange resin films are stacked alternately, and each of the cation-exchange resin films and the anion-exchange resin films is sandwiched between two of the electrodes. A voltage is applied such that the electrodes between adjacent ones of the cation-exchange resin films and anion-exchange resin films have the same polarity.

9 Claims, 5 Drawing Sheets

(56) References Cited

U.S. PATENT DOCUMENTS

| | | | |
|---|---|---|---|
| 2005/0136321 A1* | 6/2005 | Bailey | 429/72 |
| 2007/0209915 A1* | 9/2007 | Takagi et al. | 200/181 |

FOREIGN PATENT DOCUMENTS

| | | | | |
|---|---|---|---|---|
| JP | 08280187 A | * | 10/1996 | |
| JP | A-9-79129 | | 3/1997 | |
| JP | A-11-206162 | | 7/1999 | |
| JP | B2-2961125 | | 10/1999 | |
| JP | 2000-212306 A | | 8/2000 | |
| JP | 2001-244514 A | | 9/2001 | |
| JP | 2002330598 A | * | 11/2002 | |
| JP | A-2003-170400 | | 6/2003 | |
| JP | 2005-033991 A | | 2/2005 | |
| JP | 2005051949 A | * | 2/2005 | |
| JP | 2005199389 A | * | 7/2005 | |
| JP | 2006299842 A | * | 11/2006 | |
| JP | A-2008-35682 | | 2/2008 | |
| JP | 2008079462 A | * | 4/2008 | |
| JP | 2009-189220 A | | 8/2009 | |
| JP | 2010-067651 A | | 3/2010 | |
| JP | A-2011-41413 | | 2/2011 | |
| JP | A 2012-182896 | | 9/2012 | |
| WO | WO 2010100907 A1 | * | 9/2010 | |

OTHER PUBLICATIONS

Nagai et al. (JP 2008035682 A) English Translation.*
Yokoyama et al. (JP 2005051949 A) English Translation.*
Michael et al. (JP 2008079462 A) English Translation.*
Asai et al. (JP 2005199389 A) English Translation.*
Azumi et al. (JP 2002330598 A) English Translation.*
Abe et al. (JP 08280187 A) English Translation.*
Dono et al., "Knit Structure SMA Actuator for Wearable Artificial Muscle Systems," *Advanced Technologies Fusion Laboratory*, p. 59-63. Aug. 2003 (with translation).
Ihara et al., "Mechanoelectric Actuator for Artificial Muscle by Ion Polymer Metal Compound," p. 94-100 (with translation).

* cited by examiner

ACTUATOR AND METHOD FOR MANUFACTURING THE SAME

BACKGROUND

1. Technical Field

The present invention relates to an actuator and a method for manufacturing the same.

2. Related Art

In recent years, the need for small actuators has risen in medical fields, micromachine fields, and the like.

There is demand for these small actuators to be compact as well as be driven with a low voltage. Various attempts have been made to achieve a reduction in voltage (e.g., see JP-A-9-79129).

Known small actuators mainly use an ion-exchange membrane, which is a material that contracts and swells due to ion movement.

These actuators have the problem that, when the thickness of the ion-exchange membrane is increased in order to increase the amount of displacement, high-speed response cannot be obtained since the operation thereof is controlled by the ion diffusion rate.

SUMMARY

One aspect of the present invention provides an actuator that is small, superior in terms of high-speed response, and capable of large displacement. Also, another aspect of the present invention provides a manufacturing method capable of easily manufacturing the actuator.

An actuator according to one aspect of the invention includes: a first cation-exchange resin film; and a first anion-exchange resin film, wherein the first cation-exchange resin film and the first anion-exchange resin film are stacked in a first direction, and a first voltage having a first polarity is applied to the first cation-exchange resin film in the first direction, and a second voltage having a second polarity is applied to the first anion-exchange resin film in the first direction.

According to this configuration, an actuator that is small, superior in terms of high-speed response, and capable of large displacement is provided.

A method for manufacturing an actuator according to another aspect of the invention includes: forming a plurality of cation-exchange resin films such that for each, the thickness on a first end portion side is smaller than the thickness on a second end portion side; forming a plurality of anion-exchange resin films such that for each, the thickness on a third end portion side is smaller than the thickness on a fourth end portion side; forming a first electrode on a first face and a third face of each of the cation-exchange resin films, and forming a second electrode on a second face and a fourth face of each of the cation-exchange resin films; forming a third electrode on a fifth face and a seventh face of each of the anion-exchange resin films, and forming a fourth electrode on a sixth face and an eighth face of each of the anion-exchange resin films; joining the fourth face of one of the cation-exchange resin films and the seventh face of one of the anion-exchange resin films together via the second electrode and the third electrode; and inserting a fifth electrode between the second electrode and the third electrode that are between the second face and the fifth face.

According to this configuration, a method for manufacturing an actuator that is small, superior in terms of high-speed response, and capable of large displacement is provided.

The above actuator of the invention is configured by a laminated body including multiple electrodes, multiple cation-exchange resin films, and multiple anion-exchange resin films. The cation-exchange resin films and the anion-exchange resin films are stacked alternately, and each of the cation-exchange resin films and the anion-exchange resin films is sandwiched between two of the electrodes. A voltage is applied such that the electrodes between adjacent ones of the cation-exchange resin films and the anion-exchange resin films have the same polarity.

According to this configuration, an actuator that is small, superior in terms of high-speed response, and capable of large displacement is provided.

With the above actuator of the invention, it is preferable that the cation-exchange resin film has an thickness ranging from 20 μm to 1000 μm inclusive.

This configuration enables the actuator to increase the amount of displacement while achieving a faster response speed.

With the above actuator of the invention, it is preferable that the anion-exchange resin film has an thickness ranging from 20 μm to 1000 μm inclusive.

This configuration enables the actuator to increase the amount of displacement while achieving a faster response speed.

With the above actuator of the invention, it is preferable that the cation-exchange resin film contains fluorine-based ion-exchange resin.

This configuration enables the actuator to achieve a faster response speed.

With the above actuator of the invention, it is preferable that the anion-exchange resin film includes carbon-based ion-exchange resin.

This enables a faster response speed.

With the above actuator of the invention, it is preferable that the actuator is coated with a coating film.

According to this configuration, the durability of the actuator can be increased.

With the above actuator of the invention, it is preferable that the coating film has an thickness ranging from 0.1 μm to 100 μm inclusive.

According to this configuration, the durability of the actuator can be increased without interfering with the responsiveness of the actuator.

With the above actuator of the invention, it is preferable that the cation-exchange resin films each have a first end portion and a second end portion, a first face and a second face that oppose each other in a thickness direction on the first end portion side, and a third face and a fourth face that oppose each other in the thickness direction on the second end portion side, a gap between the first face and the second face being shorter than a gap between the third face and the fourth face, the anion-exchange resin films each have a third end portion and a fourth end portion, a fifth face and a sixth face that oppose each other in the thickness direction on the third end portion side, and a seventh face and an eighth face that oppose each other in the thickness direction on the fourth end portion side, a gap between the fifth face and the sixth face being shorter than a gap between the seventh face and the eighth face, the first electrode among the electrodes is disposed on the first face and the third face, the second electrode among the electrodes is disposed on the second face and the fourth face, the third electrode among the electrodes is disposed on the fifth face and the seventh face, the fourth electrode among the electrodes is disposed on the sixth face and the eighth face, the second electrode and the third electrode are in contact on the side of the second end portion and the fourth end portion, and a fifth electrode among the electrodes is disposed between the second electrode and third electrode on the side of the first end portion and the third end portion.

According to this configuration, an actuator that is even smaller, more superior in terms of high-speed response, and capable of larger displacement is provided.

A method for manufacturing the actuator described above according to an aspect of the invention includes: forming a plurality of cation-exchange resin films, each having a thickness on a first end portion side thereof being smaller than a thickness on a second end portion side thereof; forming a plurality of anion-exchange resin films, each having a thickness on a third end portion side thereof being smaller than a thickness on a fourth end portion side thereof; forming a first electrode on a first face and a third face of each of the cation-exchange resin films, and forming a second electrode on a second face and a fourth face of each of the cation-exchange resin films; forming a third electrode on a fifth face and a seventh face of each of the anion-exchange resin films, and forming a fourth electrode on a sixth face and an eighth face of each of the anion-exchange resin films; joining the cation-exchange resin films to the anion-exchange resin films in an alternating manner such that the third face and the eighth face are in contact via the first electrode and the fourth electrode, and the fourth face and the seventh face are in contact via the second electrode and the third electrode; and inserting a fifth electrode between the first electrode and the fourth electrode and between the second electrode and the third electrode on the side of the first end portion and the third end portion.

According to this configuration, an actuator that is even smaller, more superior in terms of high-speed response, and capable of larger displacement is provided.

DESCRIPTION OF EXEMPLARY EMBODIMENTS

Preferred embodiments of the invention will be described in detail below.

First Embodiment of Actuator

First, an actuator according to a first embodiment of the invention will be described.

Figure 1:
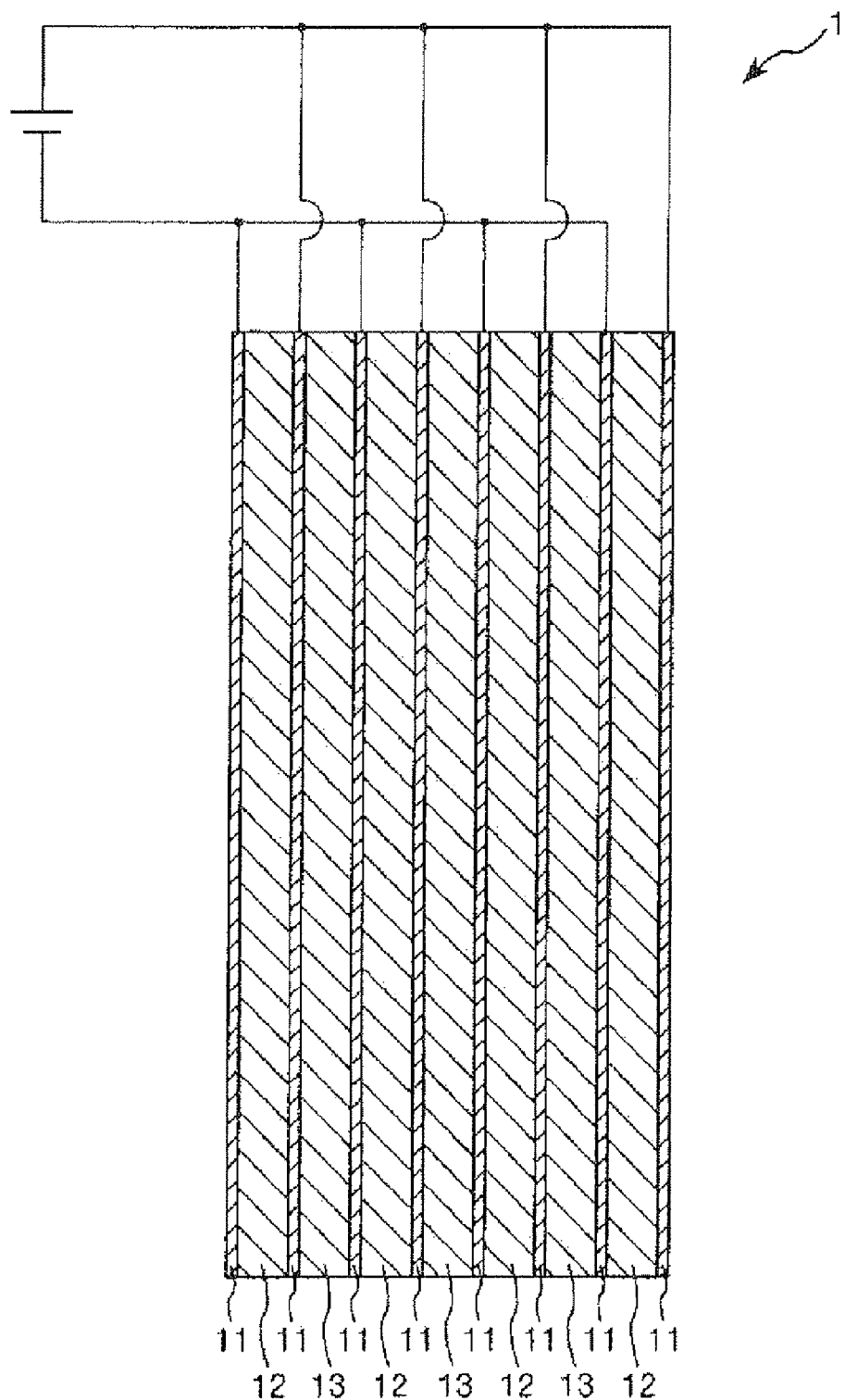
FIG. 1 is a cross-sectional diagram showing an actuator according to a first embodiment of the invention.
Figure 2:
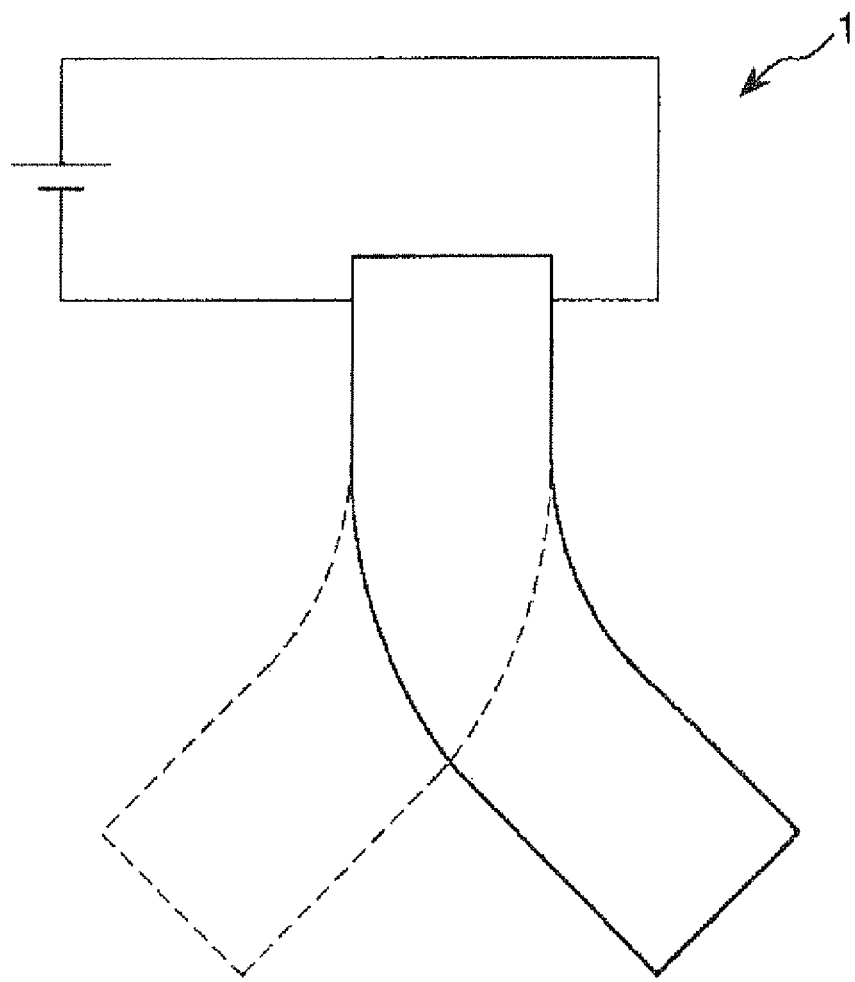
FIG. 2 is a schematic diagram showing driven states of the actuator according to the first embodiment.

FIG. 1 is a cross-sectional diagram showing an actuator according to the first embodiment of the invention, and FIG. 2 is a schematic diagram showing driven states of the actuator according to the first embodiment.

An actuator 1 is configured by a layered body in which multiple electrodes 11, multiple cation-exchange resin films 12, and multiple anion-exchange resin films 13 are stacked. As shown in FIG. 1, the actuator 1 of the present embodiment is configured by four cation-exchange resin films 12, three anion-exchange resin films 13, and eight electrodes 11.

As shown in FIG. 1, the cation-exchange resin films 12 and the anion-exchange resin films 13 of the actuator 1 are stacked alternately.

Also, one electrode 11 is disposed between each pair of the cation-exchange resin film 12 and the anion-exchange resin film 13.

Also, the cation-exchange resin films 12 and the anion-exchange resin films 13 are each sandwiched between two electrodes 11.

In other words, the actuator 1 includes an electrode 11, a cation-exchange resin film 12, an electrode 11, an anion-exchange resin film 13, an electrode 11, a cation-exchange resin film 12, an electrode 11, . . . , an anion-exchange resin film 13, and an electrode 11 laminated in layers in this order.

The electrodes 11 are connected to a power supply and have the function of applying voltage to the cation-exchange resin films 12 and the anion-exchange resin films 13.

Examples of the material that constitutes the electrodes 11 include a metal such as gold, platinum, iridium, palladium, or ruthenium, as well as carbon fiber and various types of conductive polymers.

When a voltage is applied, the cation-exchange resin films 12 each bend toward the electrode 11 that is connected to the positive electrode of the power supply. This is because as cations in the cation-exchange resin film 12 move toward the negative side, the water molecules thereof also move, thus causing the negative side of the cation-exchange resin film 12 to swell, and the positive side to contract.

Although there are no particular limitations on the cation-exchange resin that constitutes the cation-exchange resin films 12, it is preferable to use a fluorine-based ion-exchange resin. This enables increasing the amount of displacement while achieving a faster response speed.

Examples of the fluorine-based ion-exchange resin include Nanion (brand name, made by DuPont) and Flemion (brand name, made by Asahi Glass Co., Ltd.).

The thickness of each cation-exchange resin film 12 is preferably in the range of 20 µm to 1000 µm inclusive, or more preferably in the range of 100 µm to 500 µm inclusive. This can increase the amount of displacement while achieving a faster response speed.

When a voltage is applied, the anion-exchange resin films 13 each bend toward the electrode 11 that is connected to the negative electrode of the power supply. This is because as anions in the anion-exchange resin film 13 move toward the positive side, the water molecules thereof also move, thus causing the positive side of the anion-exchange resin film 13 to swell, and the negative side to contract.

Although there are no particular limitations on the anion-exchange resin that constitutes the anion-exchange resin films 13, it is preferable to use a carbon-based ion-exchange resin. This can increase the amount of displacement while achieving a faster response speed.

One example of the carbon-based ion-exchange resin is Aciplex (brand name, made by Asahi Kasei Corp.).

The thickness of each anion-exchange resin film 13 is preferably in the range of 20 µm to 1000 µm inclusive, or more preferably in the range of 100 µm to 500 µm inclusive. This configuration enables the actuator to increase the amount of displacement while achieving a faster response speed.

Also, it is preferable that the actuator 1 is entirely coated with a coating film. This configuration can prevent vaporization of water in the ion-exchange resin films, thus increasing the durability of the actuator 1.

Although there are no particular limitations on the material constituting the coating film, examples thereof include polyolefins such as polyethylene and polypropylene, as well as polyvinyl chloride, polyester, polyamide, polyether amide, polyurethane, fluorocarbon resin, and silicone rubber.

The thickness of the coating film is preferably in the range of 0.1 μm to 100 μm inclusive, or more preferably in the range of 1 μm to 10 μm inclusive. This can increase the durability of the actuator without interfering with the response of the actuator.

With the actuator 1 having the configuration described above, when a voltage is applied to the electrodes, the cation-exchange resin films 12 and the anion-exchange resin films 13 bend in the same direction (as indicated by solid line in FIG. 2), and the entirety of the actuator 1 bends a large amount. Also, since thin ion-exchange resin films are used, a reduction in the speed of ion movement can be prevented, and the response speed can be increased. Also, the direction in which the actuator 1 bends can be changed, as shown in FIG. 2, by switching the power supply between positive and negative.

Although the actuator 1 is described above in accordance with an embodiment, the invention is not limited to the embodiment described above. For example, although the actuator 1 is configured with four cation-exchange resin films 12, three anion-exchange resin films 13, and eight electrodes 11 in the above description, the invention is not limited to these numbers, and it is sufficient that the actuator 1 is provided with multiple cation-exchange resin films 12, anion-exchange resin films 13, and electrodes 11.

Second Embodiment of Actuator

Next, an actuator according to a second embodiment of the invention will be described.

Figure 3:
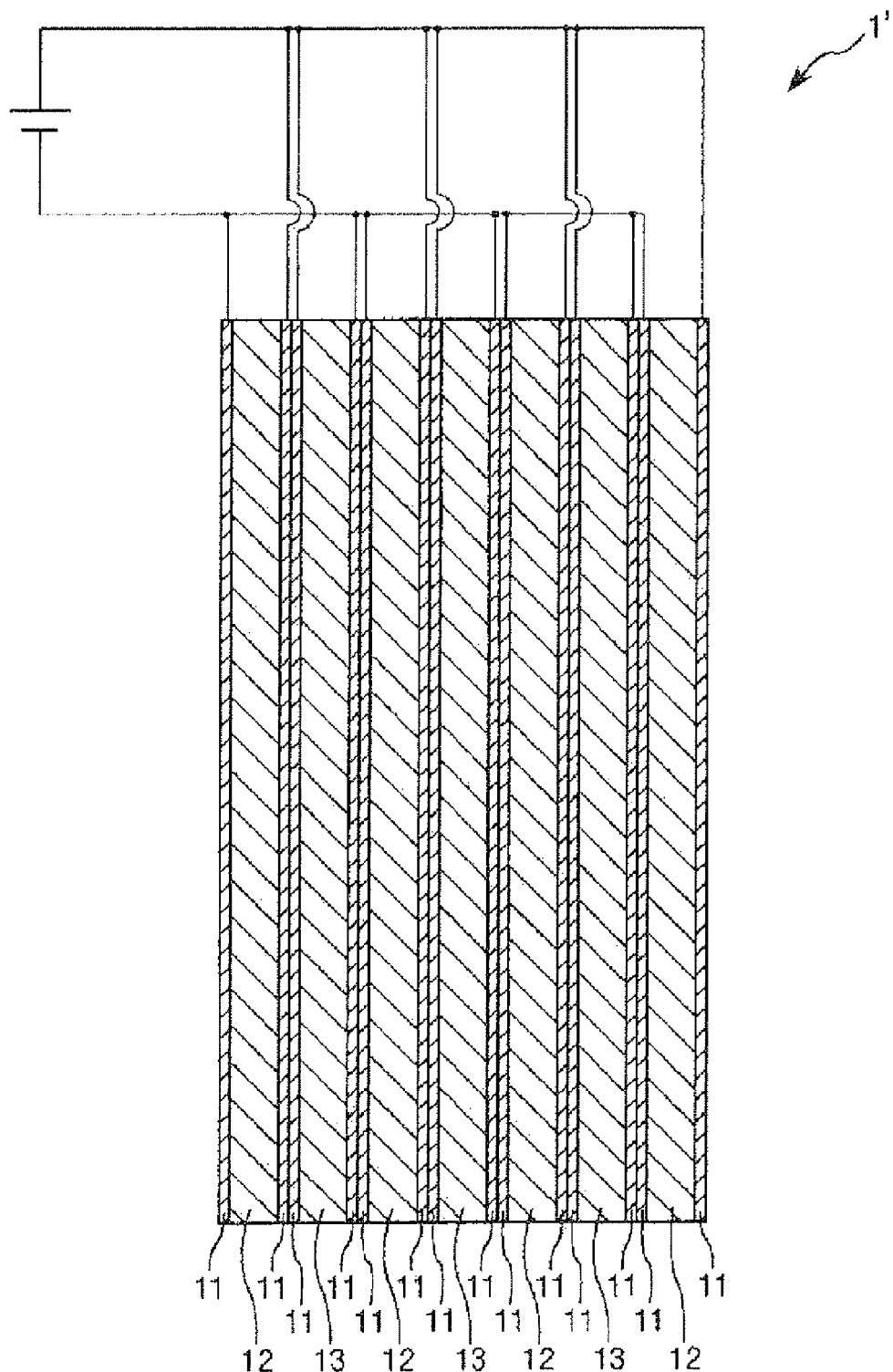
FIG. 3 is a cross-sectional diagram showing an actuator according to a second embodiment of the invention.

FIG. 3 is a cross-sectional diagram showing an actuator according to a second embodiment of the invention.

Similar to the embodiment described above, an actuator 1' of the present embodiment is configured by a layered body in which multiple electrodes 11, multiple cation-exchange resin films 12, and multiple anion-exchange resin films 13 are stacked. As shown in FIG. 3, the actuator 1' of the present embodiment is configured by four cation-exchange resin films 12, three anion-exchange resin films 13, and fourteen electrodes 11.

Similar to the embodiment described above, the cation-exchange resin films 12 and the anion-exchange resin films 13 of the actuator 1' are stacked alternately.

Unlike the embodiment described above, two of the electrodes 11 are disposed between each pair of the cation-exchange resin film 12 and the anion-exchange resin film 13.

Specifically, the actuator 1' is configured such that the cation-exchange resin film 12 is sandwiched between two of the electrodes 11, the anion-exchange resin film 13 is sandwiched between another two of the electrodes 11, and these two sets are alternately stacked.

According to the configuration described above, the actuator 1' having superior high-speed responsiveness and capable of large displacement can be provided, and the actuator 1' can be readily manufactured.

Method for Manufacturing Actuator 1'

Next, an example of a method for manufacturing the actuator 1' will be described.

FIGS. 4A to 4D are diagrams showing steps in one example of a method for manufacturing an actuator.

First, four cation-exchange resin films 12 and three anion-exchange resin films 13 are prepared. In FIGS. 4A to 4D, the top and bottom of the cation-exchange resin film 12 are respectively referred to as the first end portion and the second end portion, and the top and bottom of the anion-exchange resin film 13 are respectively referred to as the third end portion and the fourth end portion. Also, the left and right faces of the first end portion are respectively referred to as the first face and the second face, the left and right faces of the second end portion are respectively referred to as the third face and the fourth face, the left and right faces of the third end portion are respectively referred to as the fifth face and the sixth face, and the left and right faces of the fourth end portion are respectively referred to as the seventh face and the eighth face. A gap 4 between the first face and the second face is shorter than a gap 5 between the third face and the fourth face, and a gap 6 between the fifth face and the sixth face is shorter than a gap 7 between the seventh face and the eighth face.

Figure 4A:
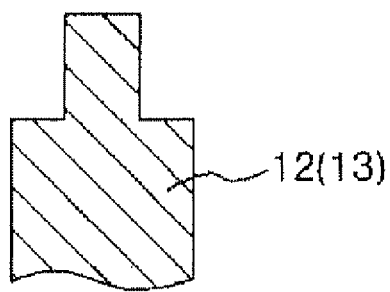
FIGS. 4A to 4D are diagrams showing steps in one example of a method for manufacturing an actuator according to an embodiment of the invention.

Next, as shown in FIG. 4A, one end portion of each film (the first end portion and the third end portion) is molded by press molding or the like such that the thickness in part of that end portion decreases.

Figure 4B:
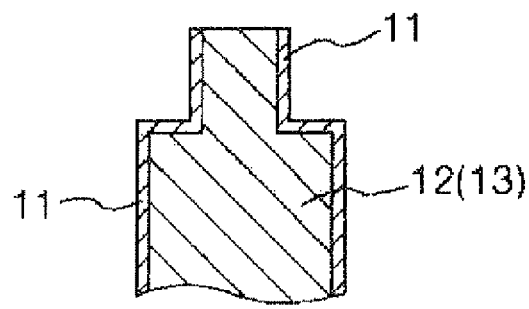

Next, a pair of electrodes 11 is formed on two surfaces of each of the four cation-exchange resin films 12 and on two surfaces of each of the three anion-exchange resin films 13 (FIG. 4B). In FIGS. 4A to 4D, the electrode 11 disposed on the first face and the third face is referred to as the first electrode, the electrode 11 disposed on the second face and the fourth face is referred to as the second electrode, the electrode 11 disposed on the fifth face and the seventh face is referred to as the third electrode, and the electrode 11 disposed on the sixth face and the eighth face is referred to as the fourth electrode.

When Nafion (brand name, made by DuPont) is used for the cation-exchange resin films 12, the electrodes 11 (made of plated gold) can be formed as described below, for example.

A film of Nafion (cation-exchange resin film 12), with a part of one end portion thereof being molded as described above, is immersed for approximately twelve hours in an aqueous solution of dichlorophenanthroline gold, which is a gold complex, thereby causing the gold complex ions to be adsorbed into the film by ion exchange. Thereafter, the film is immersed in an aqueous solution of sodium sulfite at 60° C. for approximately five hours, during which the film surfaces are plated with gold as a result of reduction, thus forming the electrodes 11.

On the other hand, when Aciplex (brand name, made by Asahi Kasei Corp.) is used for the anion-exchange resin films 13, the electrodes 11 (made of plated gold) can be formed as described below, for example.

An Aciplex film (anion-exchange resin film 13) is immersed for approximately twelve hours in an aqueous solution of tetrachloroauric(III) acid ($HAuCl_4$), which is a gold complex, thereby causing the gold complex ions to be adsorbed into the film by ion exchange. Thereafter, the film is immersed in an aqueous solution of sodium ascorbate at 60° C. for approximately five hours, during which the film surfaces are plated with gold as a result of reduction, thus forming the electrodes 11.

Figure 4C:
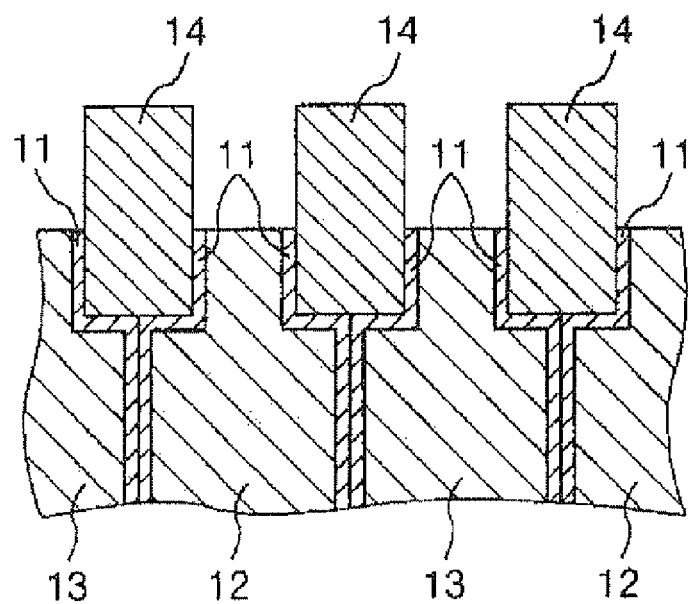
Figure 4D:
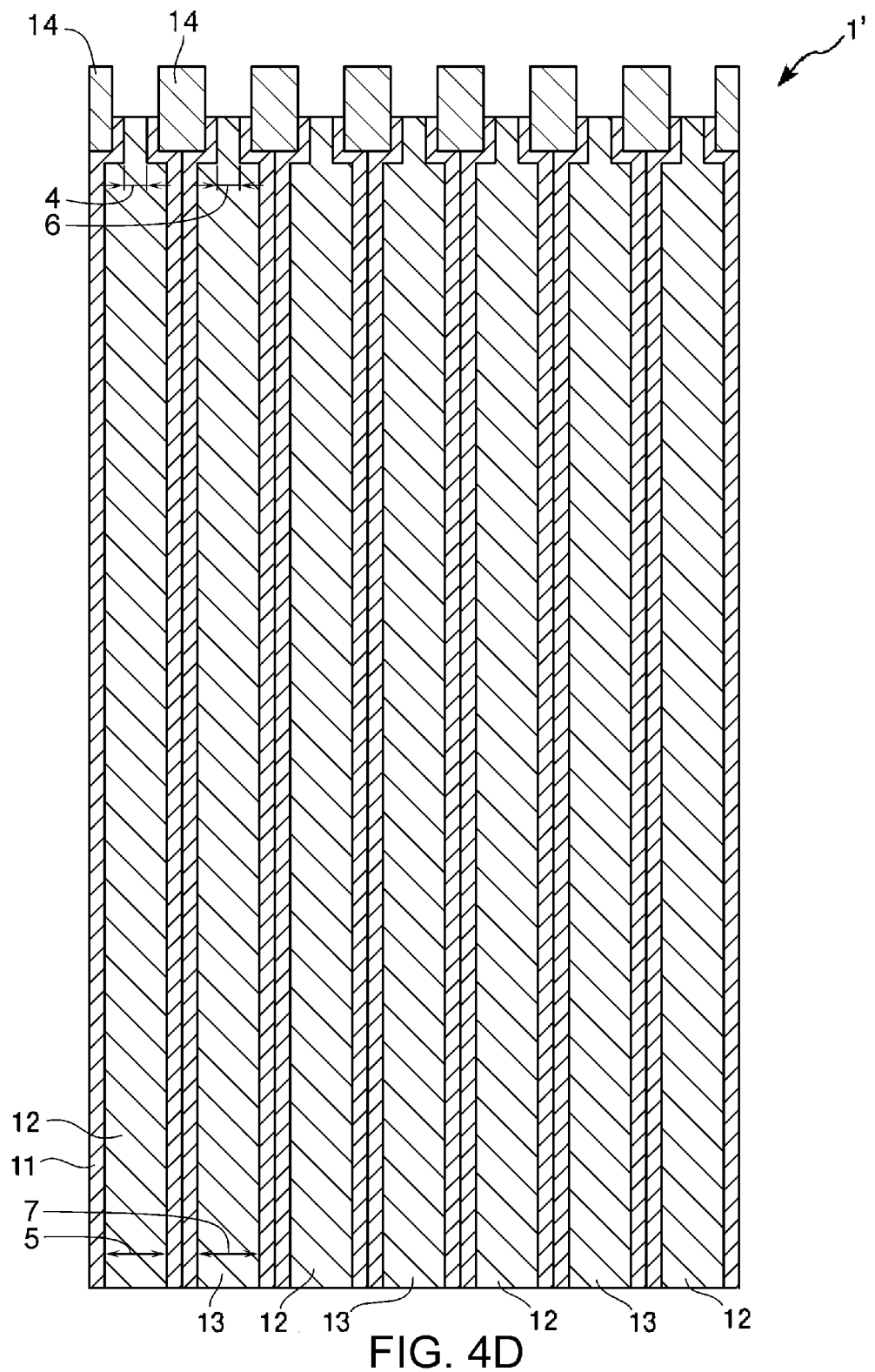

Next, as shown in FIGS. 4C and 4D, the cation-exchange resin films 12 and the anion-exchange resin films 13, each of which has electrodes 11 formed on two surfaces thereof, are joined together alternately. Specifically, the third face and the eighth face are in contact via the first electrode and the fourth electrode, and the fourth face and the seventh face are in contact via the second electrode and the third electrode. At this time, terminals 14 (fifth electrodes) for connecting the electrodes 11 with the power supply are respectively inserted into the spaces formed in part of the cation-exchange resin films 12 and the anion-exchange resin films 13 that were molded as described above. Specifically, a fifth electrode is inserted between the first electrode and the fourth electrode on the side of the first end portion side and the third end portion, and also between the second electrode and the third electrode on the side of the first end portion side and the third end portion.

Note that the cation-exchange resin films 12 and the anion-exchange resin films 13 can be joined together using a known conductive adhesive, for example.

Thereafter, the joined films are coated with a coating film as necessary, and then the power supply and the terminals 14 (fifth electrodes) are electrically connected, thus obtaining the actuator 1'.

Although the invention is described above based on preferred embodiments, the invention is not intended to be limited to these embodiments.

The entire disclosure of Japanese Patent Application No. 2011-200256, filed Sep. 14, 2011 is expressly incorporated by reference herein.

What is claimed is:

1. An actuator comprising:
   a first cation exchange resin film;
   a first anion exchange resin film;
   a second cation exchange resin film; and
   a second anion exchange resin film,
   the first cation exchange resin film and the first anion exchange resin film being stacked in a first direction,
   a first voltage having a first polarity that is applied to the first cation exchange resin film in the first direction, and a second voltage having a second polarity that is applied to the first anion exchange resin film in the first direction,
   the second cation exchange resin film and the second anion exchange resin film being stacked on the first anion exchange resin film in the first direction,
   the first cation exchange resin film and the second cation exchange resin film each having a first end portion and a second end portion, a first face and a second face that oppose each other in the first direction on the side of the first end portion, and a third face and a fourth face that oppose each other in the first direction on the side of the second end portion, a gap between the first face and the second face being shorter than a gap between the third face and the fourth face,
   the first anion exchange resin film and the second anion exchange resin film each having a third end portion and a fourth end portion, a fifth face and a sixth face that oppose each other in the first direction on the side of the third end portion, and a seventh face and an eighth face that oppose each other in the first direction on the side of the fourth end portion, a gap between the fifth face and the sixth face being shorter than a gap between the seventh face and the eighth face,
   the first electrode being disposed on the first face and the third face,
   the second electrode being disposed on the second face and the fourth face,
   the third electrode being disposed on the fifth face and the seventh face,
   the fourth electrode being disposed on the sixth face and the eighth face,
   the second electrode and the third electrode being in contact on the side of the second end portion and the fourth end portion, and
   a fifth electrode being disposed between the second electrode and third electrode on the side of the first end portion and the third end portion.

2. The actuator according to claim 1,
   the first cation exchange resin film being sandwiched between a first electrode and a second electrode, and
   the first anion exchange resin film being sandwiched between a third electrode and a fourth electrode.

3. The actuator according to claim 2, the second electrode being combined with the third electrode.

4. The actuator according to claim 1, the first cation exchange resin film having a thickness ranging from 20 μm to 1000 μm.

5. The actuator according to claim 1, the first anion exchange resin film having a thickness ranging from 20 μm to 1000 μm.

6. The actuator according to claim 1, the first cation exchange resin film containing fluorine based ion exchange resin.

7. The actuator according to claim 1, the first anion exchange resin film including carbon based ion exchange resin.

8. The actuator according to claim 1, the actuator being coated with a coating film.

9. The actuator according to claim 8, the coating film having a thickness ranging from 0.1 μm to 100 μm.

* * * * *